US009531333B2

(12) United States Patent
Kapinos et al.

(10) Patent No.: US 9,531,333 B2
(45) Date of Patent: Dec. 27, 2016

(54) FORMANT AMPLIFIER

(71) Applicant: Lenovo (Singapore) Pte. Ltd., Singapore (SG)

(72) Inventors: Robert James Kapinos, Durham, NC (US); Suzanne Marion Beaumont, Wake Forest, NC (US); Axel Ramirez Flores, Cary, NC (US); James Anthony Hunt, Chapel Hill, NC (US); Rod D. Waltermann, Rougemont, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 195 days.

(21) Appl. No.: 14/203,456

(22) Filed: Mar. 10, 2014

(65) Prior Publication Data
US 2015/0256137 A1    Sep. 10, 2015

(51) Int. Cl.
*H03F 3/183*    (2006.01)
*G10L 25/15*    (2013.01)
*H03F 3/45*    (2006.01)
*H03F 3/187*    (2006.01)
*G10L 21/0364*    (2013.01)
*H03G 9/00*    (2006.01)
*H03G 9/02*    (2006.01)
*G10L 15/20*    (2006.01)

(52) U.S. Cl.
CPC .......... *H03F 3/183* (2013.01); *G10L 21/0364* (2013.01); *G10L 25/15* (2013.01); *H03F 3/187* (2013.01); *H03F 3/45475* (2013.01); *H03G 9/005* (2013.01); *H03G 9/02* (2013.01); *G10L 15/20* (2013.01); *H03F 2200/03* (2013.01); *H03F 2200/165* (2013.01); *H03F 2203/45136* (2013.01); *H03F 2203/45512* (2013.01); *H03F 2203/45526* (2013.01); *H03F 2203/45528* (2013.01); *H03F 2203/45594* (2013.01); *H03F 2203/45631* (2013.01)

(58) Field of Classification Search
CPC ................................ H03F 3/183; G10L 25/15
USPC ........................................ 704/209, 246, 226
See application file for complete search history.

(56) References Cited

U.S. PATENT DOCUMENTS

| 4,979,216 | A | * | 12/1990 | Malsheen | ............... | G10L 13/08 704/260 |
| 5,459,813 | A | * | 10/1995 | Klayman | ............ | G10L 21/0364 381/82 |
| 6,292,775 | B1 | * | 9/2001 | Holmes | ................... | G10L 15/10 704/209 |
| 6,353,671 | B1 | * | 3/2002 | Kandel | ................ | H04R 25/453 381/312 |
| 2002/0173950 | A1 | * | 11/2002 | Vierthaler | ........... | G10L 21/0364 704/208 |

(Continued)

OTHER PUBLICATIONS

Ware, C., Basics of Vocal Pedagogy, McGraw-Hill, 1997 pp. 52-54, 158-160, 162 (9 pages).

(Continued)

*Primary Examiner* — Patricia T Nguyen
(74) *Attorney, Agent, or Firm* — Brian J. Pangrle

(57) ABSTRACT

A method can include receiving audio data within a band of frequencies; amplifying individualized formant frequencies within the band of frequencies; and outputting audio data that includes at least one of the amplified individualized formant frequencies. Various other apparatuses, systems, methods, etc., are also disclosed.

20 Claims, 12 Drawing Sheets

(56) References Cited

U.S. PATENT DOCUMENTS

| | | | | |
|---|---|---|---|---|
| 2006/0109983 | A1* | 5/2006 | Young | H04K 3/43 |
| | | | | 380/252 |
| 2013/0304459 | A1* | 11/2013 | Pontoppidan | H03G 3/00 |
| | | | | 704/207 |
| 2014/0309992 | A1* | 10/2014 | Carney | G10L 25/15 |
| | | | | 704/209 |

OTHER PUBLICATIONS

Beigi, H., Fundamentals of Speaker Recognition, Springer-Verlag, 2011, 89-91, 114-115 (7 pages).
Hayes et al., The IPA Vowel Chart, Winter 2012 (2 pages).

* cited by examiner

FORMANT AMPLIFIER

TECHNICAL FIELD

Subject matter disclosed herein generally relates to sound technologies.

BACKGROUND

Speech may be conveyed as acoustic energy (e.g., via longitudinal waves) where certain speech sounds include concentrated energy that may be, for example, characterized with respect to frequency. Various examples of technologies, techniques described herein pertain sound, for example, processing of sound, etc.

SUMMARY

A method can include receiving audio data within a band of frequencies; amplifying individualized formant frequencies within the band of frequencies; and outputting audio data that includes at least one of the amplified individualized formant frequencies. Various other apparatuses, systems, methods, etc., are also disclosed.

BRIEF DESCRIPTION OF THE DRAWINGS

Features and advantages of the described implementations can be more readily understood by reference to the following description taken in conjunction with examples of the accompanying drawings.

DETAILED DESCRIPTION

The following description includes the best mode presently contemplated for practicing the described implementations. This description is not to be taken in a limiting sense, but rather is made merely for the purpose of describing general principles of various implementations. The scope of invention should be ascertained with reference to issued claims.

Speech recognition may include translation of audio signals to text, commands, etc. For example, consider an utterance acquired as an audio signal via a pressure sensor such as a microphone. Such an audio signal may be analyzed for one or more characteristics to identify the utterance (e.g., recognize the utterance), which may then be used initiate further action (e.g., presentation of text, command of a device, etc.). As an example, an utterance may be defined as a unit of speech, which may be bounded (e.g., by a speaker's silence). As an example, an utterance may be a sound or sounds.

Speech recognition may include one or more grammars, for example, for analysis of audio signals that correspond to units of speech (e.g., a series of utterances). As an example, a grammar may be a set of structural rules that, for example, govern composition of clauses, phrases, and words in a language. As an example, a language may be a command oriented language such as, for example, to command operation of a device (e.g., a vehicle, a computer, etc.).

Speech recognition performance may depend on various factors. As an example, noise may interfere with analysis of one or more characteristics of an audio signal by a speech recognition system, which may be expected to perform in an environment that includes noise (e.g., ambient noise, machine noise, audio signal noise from other speakers, etc.).

As an example, a method may include receiving audio data (e.g., representative of audio signals), amplifying individualized portions of the audio data and outputting audio data that includes at least one of the amplified individualized portions. Such a method may act to facilitate analysis of one or more characteristics of the audio data, for example, to enhance speech recognition. For example, such a method may improve signal-to-noise ratio with respect to a unit or units of speech (e.g., at least in part by amplifying audio data associated with a unit or units of an individual's speech).

Figure 1:
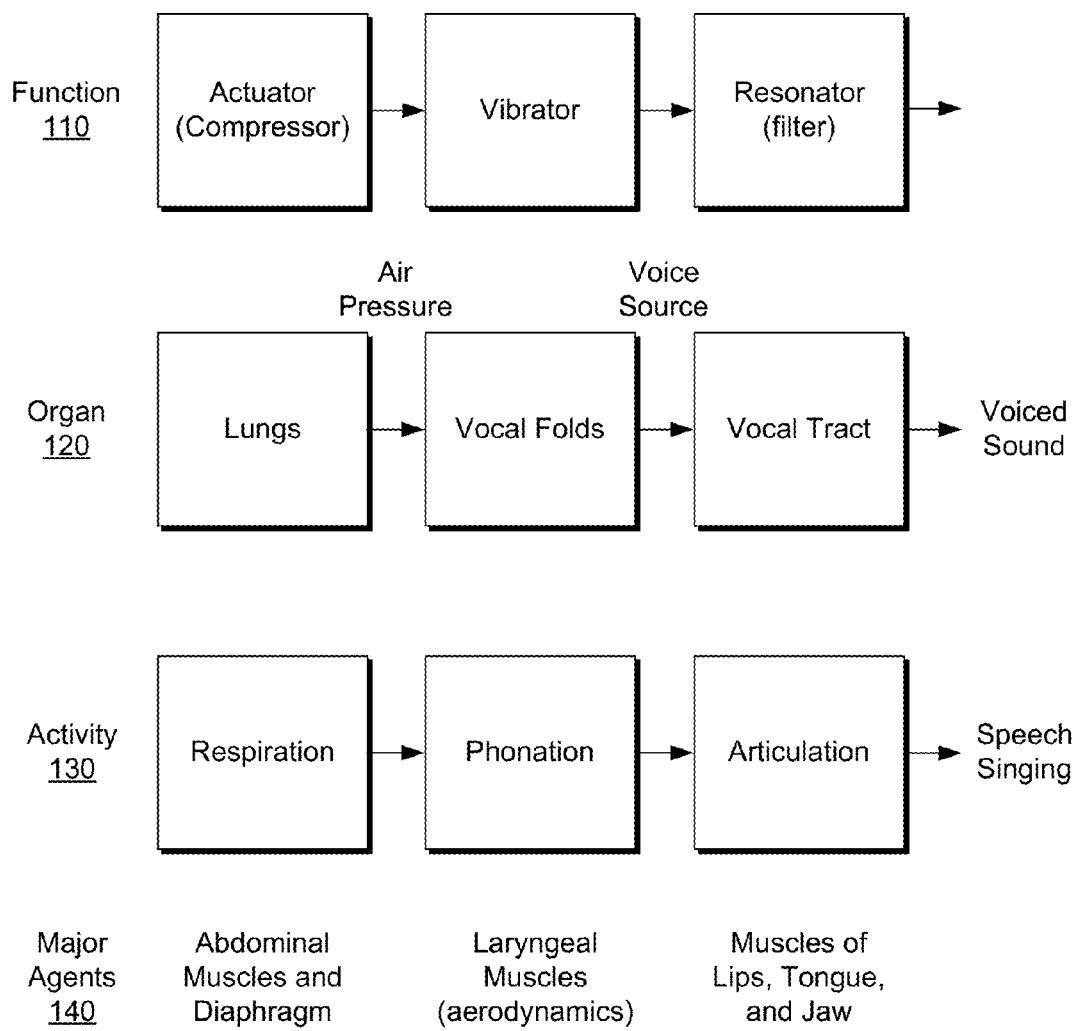
FIG. 1 is a diagram of example constituents of the vocal organ.

FIG. 1 illustrates an example of three constituents of the vocal organ 100 of a human with respect to function 110, organ 120, activity 130 and major agents 140. A human may produce sound using an actuator (e.g., a compressor), a vibrator and a resonator (e.g., a filter) as well as an articulator and the brain/nervous system (e.g., as the motivator of the vocal process). In humans, the actuator may include the lungs, which are for respiration, for example, via action of the abdominal muscles and the diaphragm. The lungs may act to compress air that may be expired via the trachea and the larynx, which includes the vocal folds. The vocal folds can act as an oscillator (e.g., a vibrator) that can convert an airstream to a sequence of air pulses that correspond to a voice source (e.g., vocal-fold vibration). The vocal tract may act as part of a resonator mechanism that can then enhance acoustic properties, for example, of air pulses generated by an airstream passing through the vocal folds. Articulation may be achieved, for example, via organs of speech (e.g., tongue, jaw, cheeks, teeth, lips, hard palate, soft palate, alveolar ridges, etc.). The human voice may be considered a natural instrument that includes an articulator capable of producing a wide variety of sounds.

As humans vary in their physiology and experiences in life (e.g., culture, training, etc.), speech generated via the vocal organ of an individual may include certain features that are characteristics of that individual. In other words, speech may be at least in part individualized.

As an example, speech may be characterized using a framework, which may be referred to as the vowel trapezoid, which may be, as an example, a polygon such as a quadrilateral (e.g., optionally lacking parallel sides). In other words, a "vowel trapezoid" may be considered a phrase that describes a concept, an aspect of a framework, etc. rather than a strict geometric shape.

Figure 2:
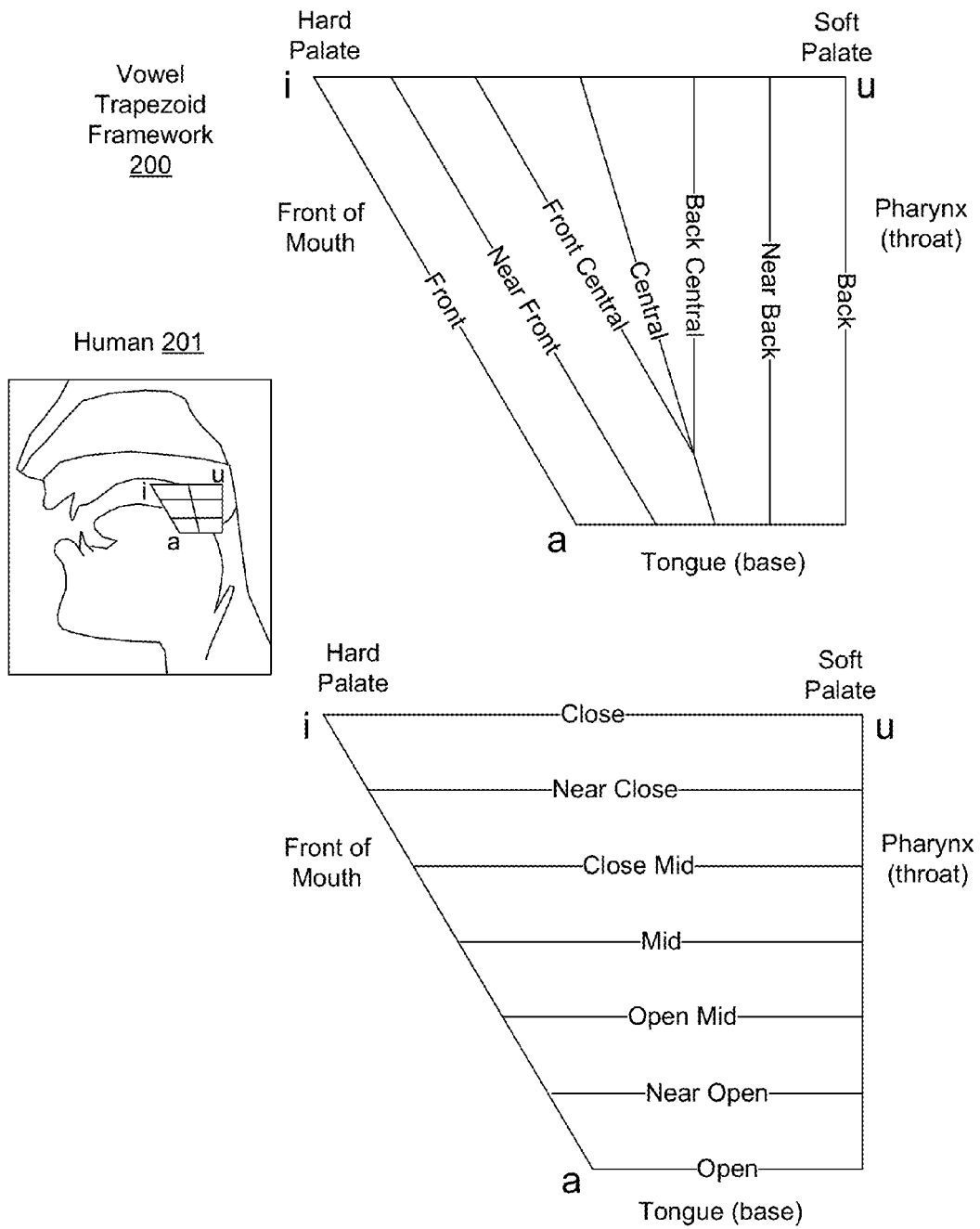
FIG. 2 is a series of diagrams of an example of a framework.

FIG. 2 shows an example of a vowel trapezoid framework 200 that is defined in part by human physiology, particularly, physiology associated with articulation, as illustrated by an approximate diagram of a human 201 with a vowel trapezoid overlaid thereon.

As an example, a vowel may be defined as a speech sound. A speech sound may be an utterance. A speech sound may be a phoneme. As an example, vowels may be considered as being different tonal spectra (e.g., colors and timbres) that can be produced with no constrictions in the vocal tract. For example, vowel resonation may be dependent upon tuning the vocal tract cavities, either separately or as a unit. In general, for a particular language, each vowel may be recognized at least in part by the human ear (e.g., optionally electronically aided) as having specific acoustical properties as created by a corresponding configuration of the vocal tract. As an example, in the English language, vowels may make up about 40 percent of all speech sounds; noting that in classical singing, the percentage tends to be higher (e.g., over 90 percent). Accordingly, as vowels play an important role in classical singing, a classical singer may generate vowel sounds that differ somewhat from those of a general population (e.g., due to training, development, etc.). As an example, with respect to a musical scale, for a singer, vowel sounds may be shifted in frequency (e.g., to sound different notes of a scale).

The International Phonetic Alphabet (IPA) is a standardized system for transliterating speech sounds into phonetic symbols. Such symbols may be used in conjunction with a framework such as, for example, the vowel trapezoid framework 200 of FIG. 2. Further, as an example, a framework may include quantitative information such as frequencies (e.g., in hertz, etc.). Frequencies may allow for characterization of speech sounds such as vowels, for example, based in part on formants.

As an example, a formant may be a region of concentrated acoustic energy in a speech sound. Formants may be resonance characteristics inherent within an individual's vocal tract. In classical singing, a singer may possibly modify the shape of the vocal tract, for example, to generate a particular speech sound. In the general population, an individual's vocal tract may be expected to be relatively consistent in shape, for example, for a particular environment (e.g., sitting at a desk, driving a car, walking down the street, etc.).

With respect to a frequency spectrum, formants may be regions of frequencies with relatively high acoustic energy. While a human may perceive a frequency spectrum over a band of frequencies, as an example, for a vowel, that human may rely more on the lowest two formant frequencies of that vowel for purposes of perception (e.g., human recognition).

As an example, a formant framework may include a first formant, a second formant, a third formant and a fourth formant. As an example, a first formant may be associated with tongue height and jaw opening and a second formant may be associated with front or back tongue positioning. As an example, consider the vowel "i", which may, upon being spoken, include a first formant centered at about 350 Hz and a second formant centered at about 2500 Hz. As indicated in the vowel trapezoid framework 200 of FIG. 2, the vowel "i" is shown as being an extremum, involving the hard palate and the front of the mouth (e.g., "front-close") as to shaping and sensing.

Figure 3:
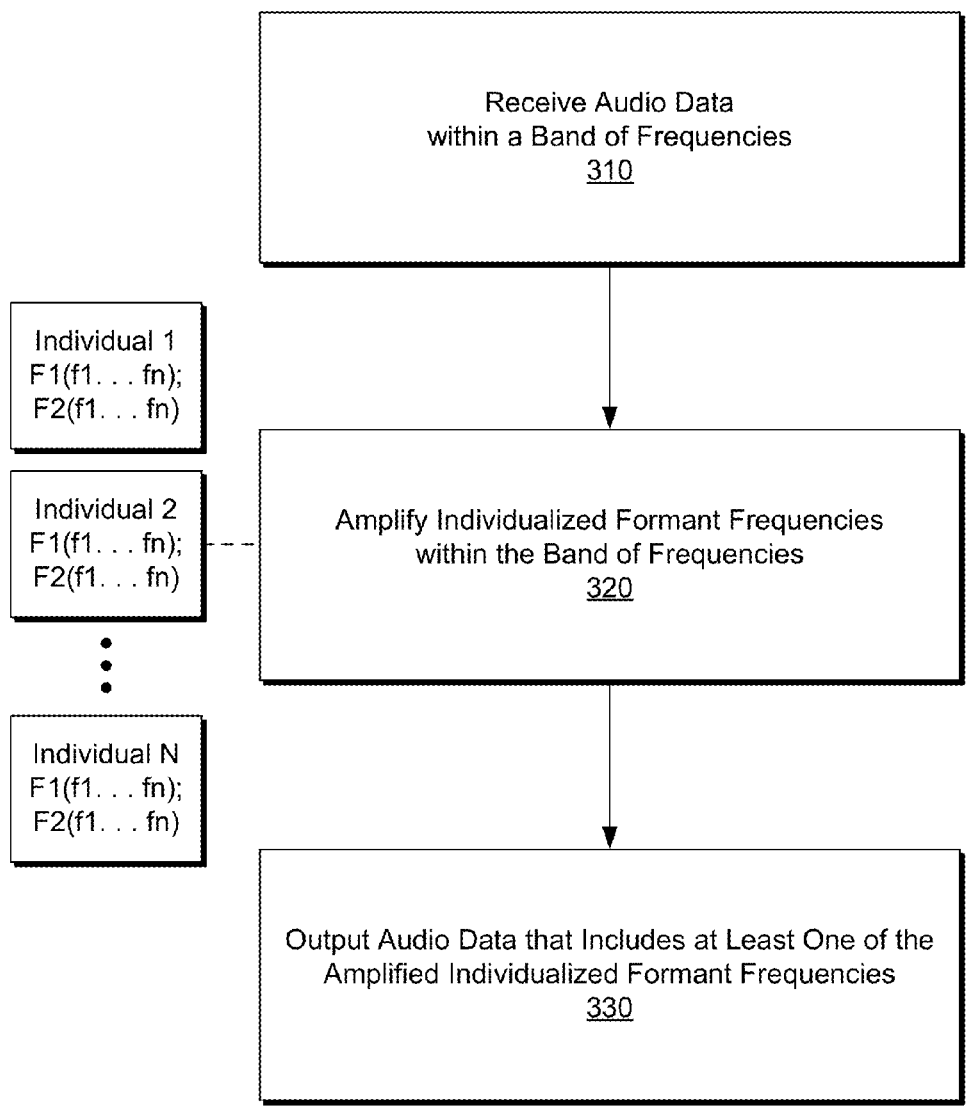
FIG. 3 is a diagram of an example of a method.

FIG. 3 shows an example of a method 300 that includes a reception block 310 for receiving audio data within a band of frequencies; an amplification block 320 for amplifying individualized formant frequencies within the band of frequencies; and an output block 330 for outputting audio data that includes at least one of the amplified individualized formant frequencies.

As shown in FIG. 3, the method 300 may include accessing information for an individual where such information includes frequencies associated with that individual. For example, for an Individual 1, information may include a listing of first formant frequencies and a listing of second formant frequencies where the listings correspond to first and second formants of a first vowel, first and second formants of a second vowel, etc. As an example, information for an Individual 2 may differ from that of the Individual 1. As an example, information for an individual may be based on an analysis of speech samples from that individual. Accordingly, in such an example, the information may be individualized (e.g., the information may include individualized formant frequencies).

Figure 4:
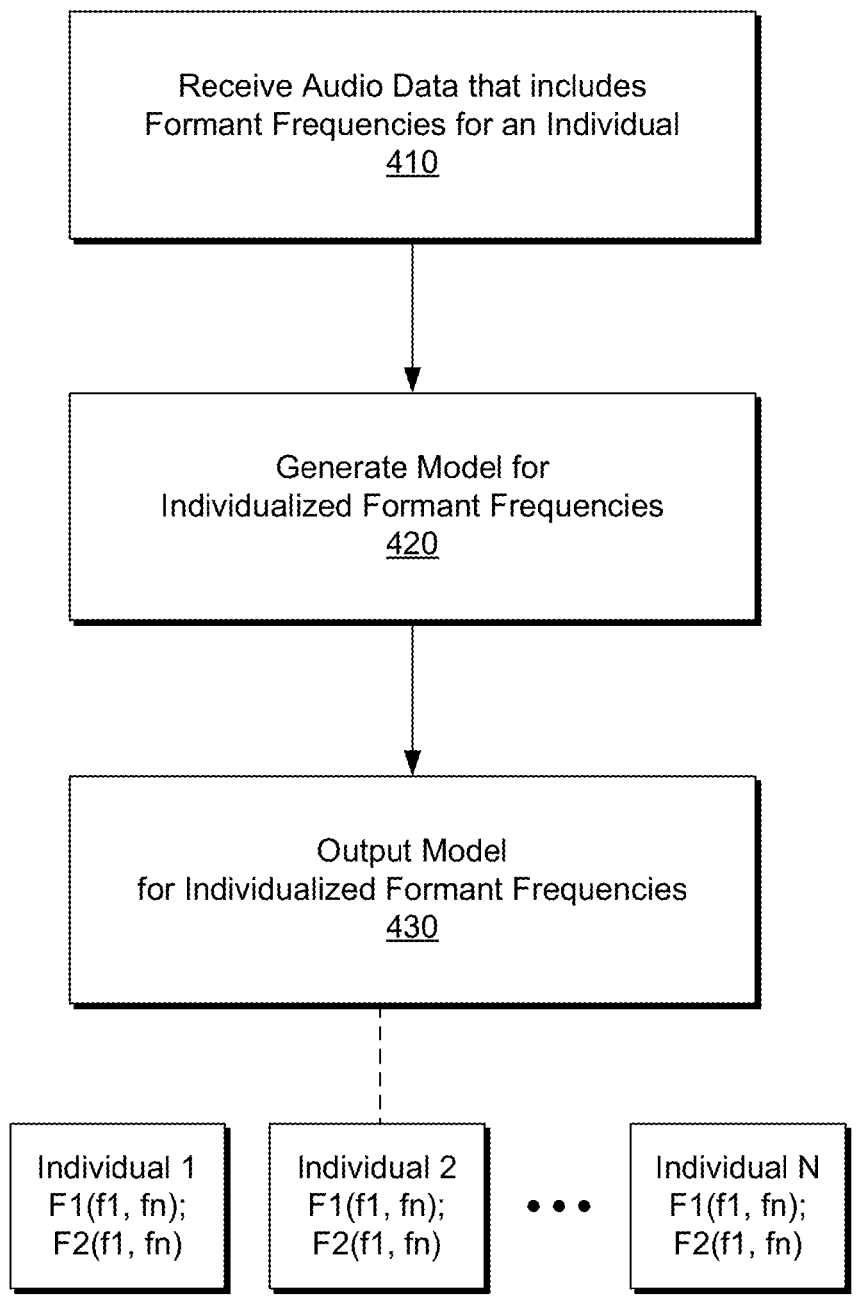
FIG. 4 is a diagram of an example of a method.

FIG. 4 shows an example of a method 400 that includes a reception block 410 for receiving audio data that includes formant frequencies for an individual, a generation block 420 for generating a model for individualized formant frequencies based at least in part on the received audio data (e.g., at least a portion of the received audio data), and an output block 430 for outputting a model for individualized formant frequencies (e.g., for the individual). As shown in FIG. 4, the method 400 may optionally be applied for audio data for multiple individuals (see, e.g., blocks for Individual 1, Individual 2, etc.).

Figure 5:
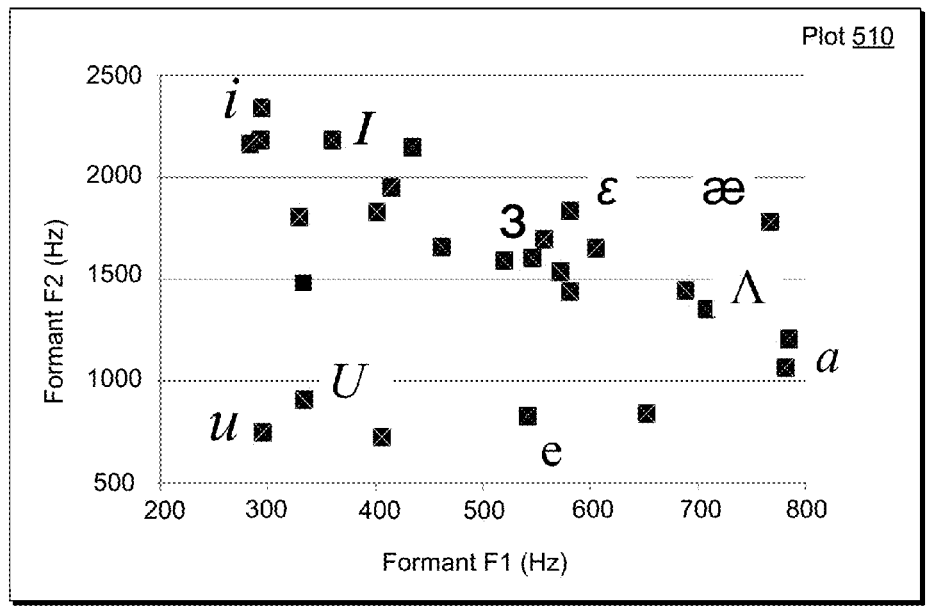
FIG. 5 is a diagram of an example of a plot and an example of a table.

FIG. 5 shows an example of a plot 510 and an example of a table 520. As shown, the plot 510 includes an axis labeled Formant F1 ranging from about 200 Hz to about 800 Hz and an axis labeled Formant F2 ranging from about 500 Hz to about 2500 Hz. Such a plot may define a formant space. As an example, one or more additional formants may be added, for example, via one or more corresponding additional axes, dimensions, etc. The table 520 includes various sounds and first formant and second formant frequencies for the sounds. As an example, the IPA may be used and/or another convention to label sounds. For example, the plot 510 includes some IPA labels (e.g., $_3$, $\wedge$, etc.) while the table 520 includes some other types of sound descriptors (e.g., "backwards epsilon", which, in IPA is "$_3$"; "caret", which, in IPA is "$\wedge$", etc.).

As mentioned with respect to the vowel trapezoid framework 200 of FIG. 2, various sounds may be classified with respect to positions in a vowel trapezoid (e.g., front-central-back, close-mid-open; front-central-back, high-mid-low; etc.). As an example, a close classification may be further classified as upper close and lower close, a mid classification may be further classified as upper mid and lower mid, and an open classification may be further classified as upper open and lower open.

As an example, a classification scheme may include terms such as, for example, rounded and unrounded. In such an example, rounded may refer to rounding of the lips (e.g., as part of articulation); whereas, unrounded may refer to lack of rounding of the lips (e.g., as part of articulation). As an example, a classification scheme may include terms such as, for example, tense and lax. In such an example, tense may refer to close (e.g., or closed) types of sounds, which may include more active involvement of the tongue; whereas, lax may refer to open (e.g., or opened) types of sounds, which may involve less tongue elevation.

Figure 6:
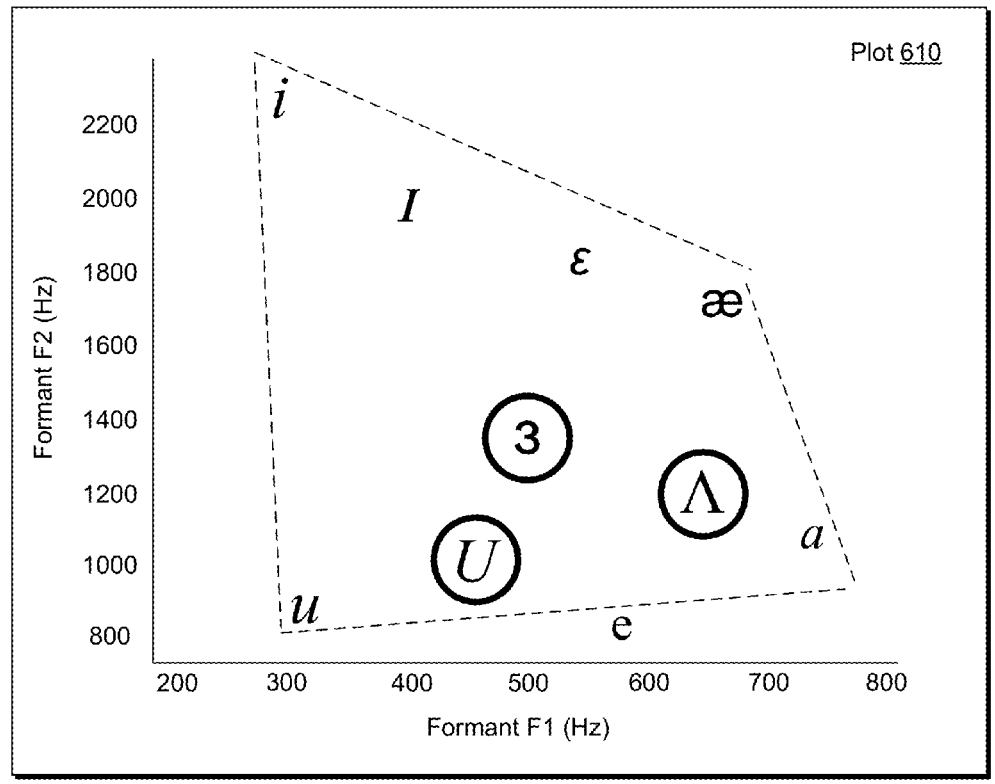
FIG. 6 is a diagram of an example of a plot and examples of sounds.

FIG. 6 shows an example of a plot 610 and examples of some sounds 630 identified in the plot 610. As an example, the plot 610 may be a plot of model data, for example, formant frequency data with respect to a formant frequency space. As an example, the sounds 630 may be sample sounds that may be used to form an individualized model. For example, audio data may include the sounds 630 for an individual where the audio data may be input to a system that generates an individualized model based at least in part on the audio data. As an example, a model generation technique may include adjusting a model based on one or more positions of a sampled sound in a formant frequency space.

In the example of FIG. 6, the sounds 630 include a lower mid, central unrounded sound (e.g., in IPA ɜ); a lower mid, back unrounded sound (e.g., in IPA ʌ); and a lower high, back rounded sound (e.g., in IPA ʊ). As an example, an individualized model may be based at least in part on one of the sounds 630. As an example, individualized formant frequencies may be based at least in part on one of the sounds 630.

Figure 7:
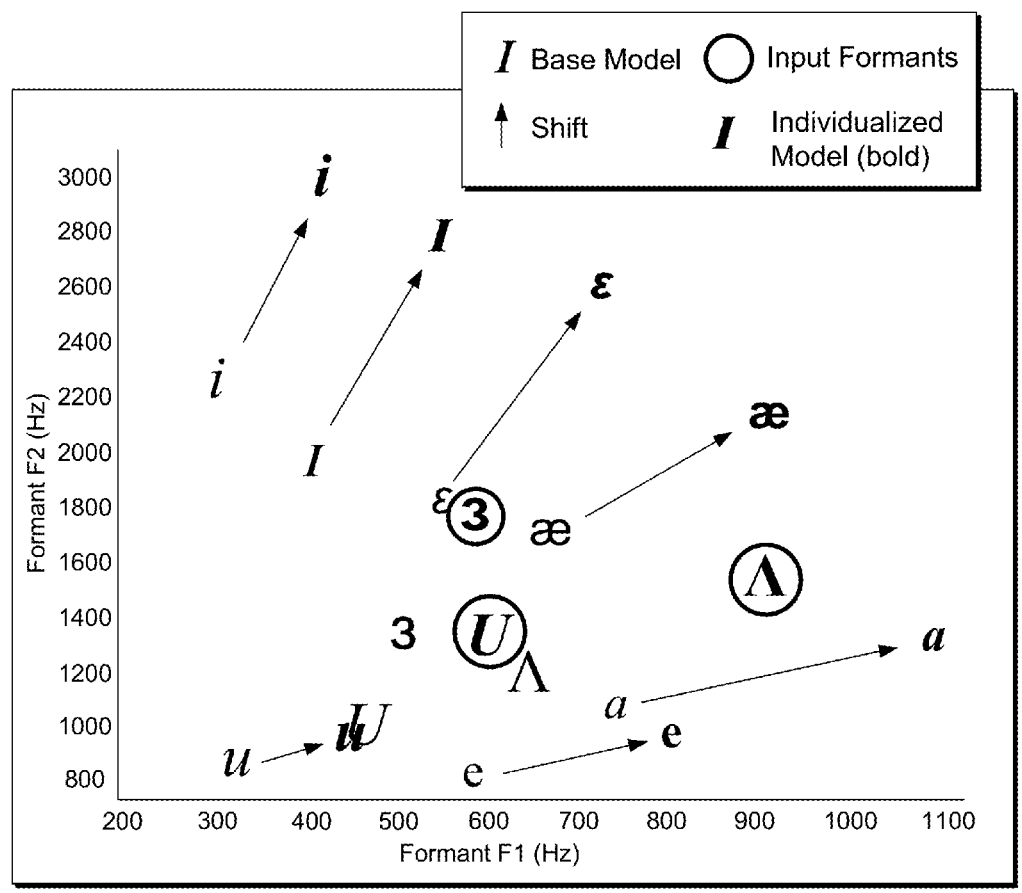
FIG. 7 is a diagram of an example of a technique.

FIG. 7 shows an example of a model generation technique 700. In the example of FIG. 7, a base model is provided whereby input of formants can be used to generate an individualized model. For example, an individualized model may be formed at least in part by shifting one or more formants of a sound in a formant space to one or more new locations in the formant space. In such an example, the shift or shifts may be to represent formants as individualized formants in a formant space.

As an example, an individualized model may be generated, at least in part, by determining one or more differences between formants of a sound in a base model and measured formants of the sound for an individual. For example, an individualized model may be generated by shifting one or more sounds of a base model to "match" one or more of the sounds 630 of FIG. 6. In such an example, shifting may generate an individualized model. As an example, a least squares or other error minimization technique may be applied for matching. As an example, a technique may include inputting at least two points and shifting a base model based at least in part on the at least two points to output an individualized model.

As an example, an individualized model may be formed via a method that includes analyzing utterances, for example, in the context of a vowel trapezoid framework. In such an example, a few detected utterances (e.g., sounds, words, etc.) may be acquired, received, etc. as a sample that may be analyzed to determine a mode of formative sounds within the sample. As an example, a sample may include as few as three words, which may include particular sounds for purposes of determining an individualized mode. In such an example, an individualized model may be constructed based at least in part on the individualized mode. As an example, an individualized mode may be a sample of sounds represented in a formant space, for example, according to a vowel trapezoid framework. As an example, an individualized mode may include a spectrum that includes spectral peaks for one or more sounds produced by an individual.

As an example, a method may implement circuitry for constructing an individualized model. For example, circuitry may perform a sweep or sweeps of low, high, and noise reducing filters as to an individualized mode (e.g., a spectrum). In such an example, outputs of the sweep or sweeps may be analyzed with an aim to avoid or minimize aliasing artifacts that could possibly be introduced into one or more regions of a spectrum, for example, where formants occur or may occur. As an example, a method may implement circuitry for checking signal quality, for example, to help ensure that a reduction in signal quality in one or more formant frequencies is avoided or minimized (e.g., to an acceptable level). As an example, a method may include outputting one or more values of one or more parameters based at least in part on a sweep or sweeps (e.g., of an individualized mode). In such an example, the one or more values may be applied (e.g., as circuitry), for example, to produce a least amount of distortion and a largest amount of noise reduction. Such circuitry may be applied to audio signals, data, etc., for example, for purposes of speech recognition. For example, such circuitry may perform one or more of filtering and amplifying audio signals, data, etc. As an example, circuitry may include digital signal processing (DSP) circuitry, for example, that may be configured to implement one or more filters, amplifiers, etc. and, for example, that may be configured to adjust, select, etc. one or more parameters associated with processing signals (e.g., processing audio signals as digital data).

Figure 8:
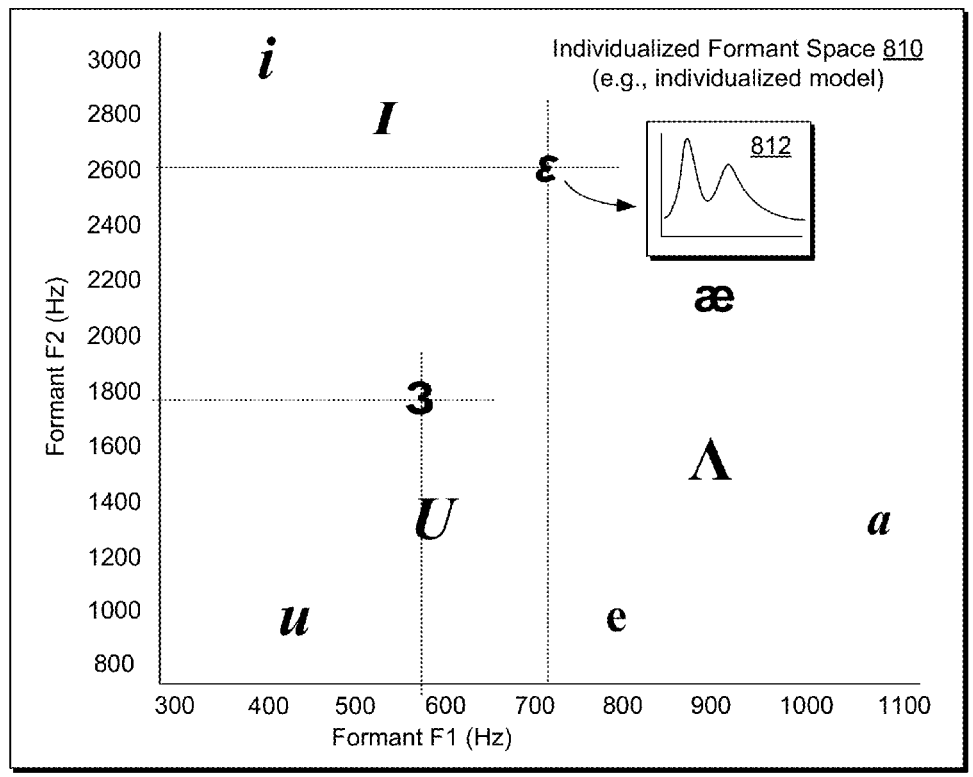
FIG. 8 is a diagram of an example of an individualized formant space and an example of a plot of individualized formant frequency gain.
Figure 8:
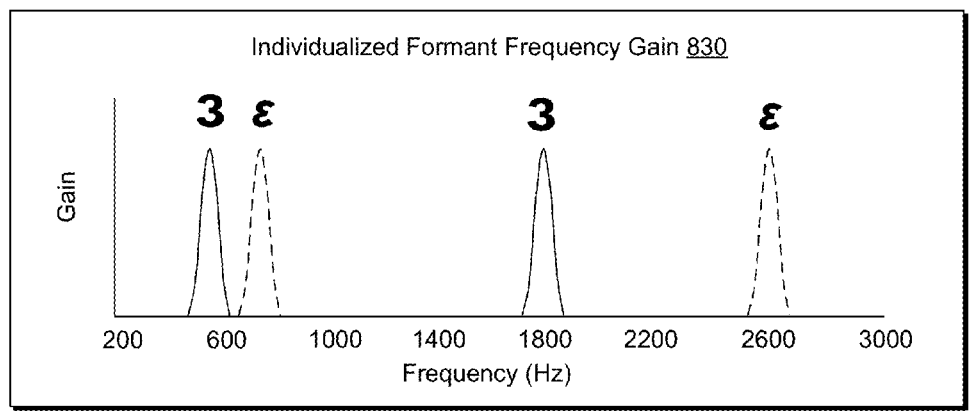

FIG. 8 shows an example of an individualized formant space 810, which may correspond to an individualized model, an example of a plot 812 illustrative of amplitude versus frequency for a sound, and an example of a plot of individualized formant frequency gain 830. As shown in the example of FIG. 8, various sounds are associated with first and second formant frequencies. As an example, an amplifier may be configured to apply a gain or gains to first and second formant frequencies of particular sounds (see, e.g., the plot 830). In such an example, the amplifier may act to diminish (e.g., filter out) frequencies that do not correspond to a first formant or a second formant of a sound (e.g., or collection thereof for a plurality of sounds). As an example, first and second formant frequencies of a sound may be first and second formant frequencies of a vowel (e.g., the sound may be a vowel). While the example of FIG. 8 shows first and second formant frequencies as being amplified for two sounds, an amplifier (e.g., a device or system) may be configured to amplify first and second formant frequencies for one or more of the other sounds illustrated in the individualized formant space 810.

As an example, a gain may be at a particular level (e.g., amplification factor, dB, etc.) that may optionally be individualized to a formant, optionally with respect to another formant. As an example, a first formant of a sound may be amplified by a corresponding gain and a second formant of a sound may be amplified by a corresponding gain, which may differ from the gain of the first formant of the sound. As an example, an amplifier may be configured with respect to a relationship between spectral peaks for two or more formants. For example, a first formant of a sound for an individual may have a spectral peak amplitude that exceeds that of a second formant of the sound for the individual. In such an example, an amplifier may apply gain in a manner that acts to maintain (e.g., preserve) a relationship between amplitudes of the spectral peaks (e.g., the spectral peak for the first formant and the spectral peak for the second formant). As an example, a parameter for a first formant and a second formant of a vowel may be a ratio that may be based at least in part on peak amplitudes).

As an example, a spectrum for a sound (e.g., an utterance, a vowel, a unit, etc.) may include multiple spectral peaks over a range of frequencies (see, e.g., the plot 812). As an example, circuitry may process a spectrum that may be emitted over a period of time (e.g., a spectrogram), for example, where the period of time corresponds to duration of a sound. In such an example, spectral peaks may be amplified and, for example, portions of the spectrum not corresponding to the spectral peaks may be diminished (e.g., over a spectrogram). As an example, circuitry may amplify amplitude and diminish amplitude (e.g., based at least in part on frequency as associated with amplitude).

Figure 9:
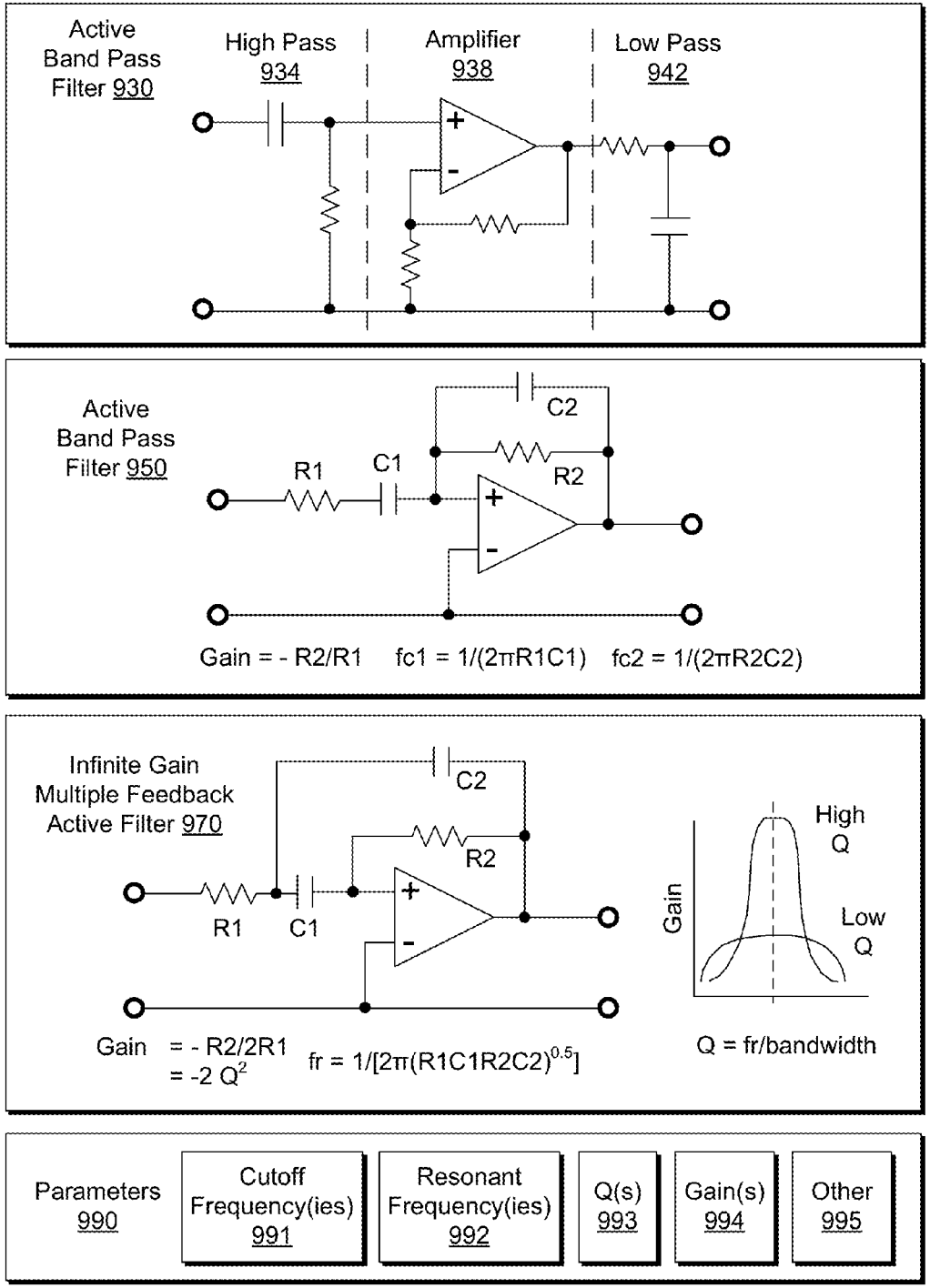
FIG. 9 is a diagram of examples of circuitry and examples of parameters.

FIG. 9 shows examples of circuitry 930, 950 and 970 and examples of parameters 990. The circuitry 930 may be configured as an active band pass filter that includes a high pass portion 934, an amplifier 938 and a low pass portion 942. For example, signals with frequencies higher than a cutoff frequency of the high pass portion 934 may be provided to the amplifier 938 for amplification and amplified signals may then be provided to the low pass portion 942 where signals with frequencies less than a cutoff frequency of the low pass portion 942 may be output, for example, for further processing, analysis, etc. The circuitry 950 may be configured as an active band pass filter and include two cutoff frequencies (e.g., fc1 and fc2) that, for example, define a frequency band. The circuitry 970 may be configured as an infinite gain multiple feedback active filter that includes a resonant frequency where a Q factor may define at least in part a bandwidth about the resonant frequency. For example, a high Q value may result in a narrower bandwidth than a low Q value.

As shown in FIG. 9, circuitry may operate according to one or more parameters. For example, circuitry may operate with respect to one or more cutoff frequencies 991, one or more resonant frequencies 992, one or more Q values 993, one or more gains 994 and/or one or more other parameters 995.

As an example, a method may include setting a value for a parameter based at least in part on audio data. For example, an input may receive audio data and circuitry may analyze audio data to determine a value or values for one or more parameters. In such an example, circuitry may be constructed and/or instructed to operate according to a determined parameter value or parameter values. As an example, circuitry may operate to amplify individualized formant frequencies. As an example, such circuitry may include one or more filters.

As an example, circuitry may include a low pass filter. In such an example, the low pass filter may pass frequencies less than a maximum formant frequency, which may be a maximum second formant frequency (e.g., of sounds that each include a first formant frequency and a second formant frequency).

As an example, circuitry may include a high pass filter. In such an example, the high pass filter may pass frequencies greater than a minimum formant frequency, which may be a minimum first formant frequency (e.g., of sounds where each includes a first formant frequency and a second formant frequency).

As an example, circuitry may include a low pass filter and a high pass filter. As an example, circuitry may include a low pass filter defined by a low pass cutoff frequency, a high pass filter defined by a high pass cutoff frequency and one or more filters and/or amplifiers that operate on at least a portion of the frequencies between the low pass cutoff frequency and the high pass cutoff frequency.

As an example, circuitry may be configured to detect a few words as a sample and to analyze that sample to determine a trapezoidal mode of formative sounds within the sample. As an example, as few as three words may be used to determine a trapezoidal mode (e.g., depending on the utterance). In such an example, a sweep of low, high, and noise reducing filters may be applied to the trapezoidal mode using circuitry (e.g., DSP, etc.). As an example, outputs of sweeps may be analyzed with a goal that aliasing artifacts are not introduced in areas where formants occur. Additionally, one or more checks may be made that an unacceptable reduction in signal quality does not occurs in the formant frequencies (e.g., to a degree that may impact speech recognition, etc.). As an example, sweep parameters that produce a least amount of distortion and a largest amount of noise reduction may be used for subsequent filtering (e.g., of audio signals, digital audio data, etc.). In such an example, the parameters may be considered to be individualized, for example, as corresponding to an individual that produced the sample sounds.

As an example, circuitry may implement one or more statistical processing techniques to process one or more samples, for example, to determine one or more parameters (e.g., for subsequent implementation). As an example, a statistical processing technique may include a network model or other type of model. As an example, a processing technique may implement one or more of a neural network model, a Hidden Markov Model, etc. As an example, a method may include model training and model implementation (e.g., of a trained model). As an example, a model may model one or more circuits (e.g., amplification, filtering, etc.).

Figure 10:
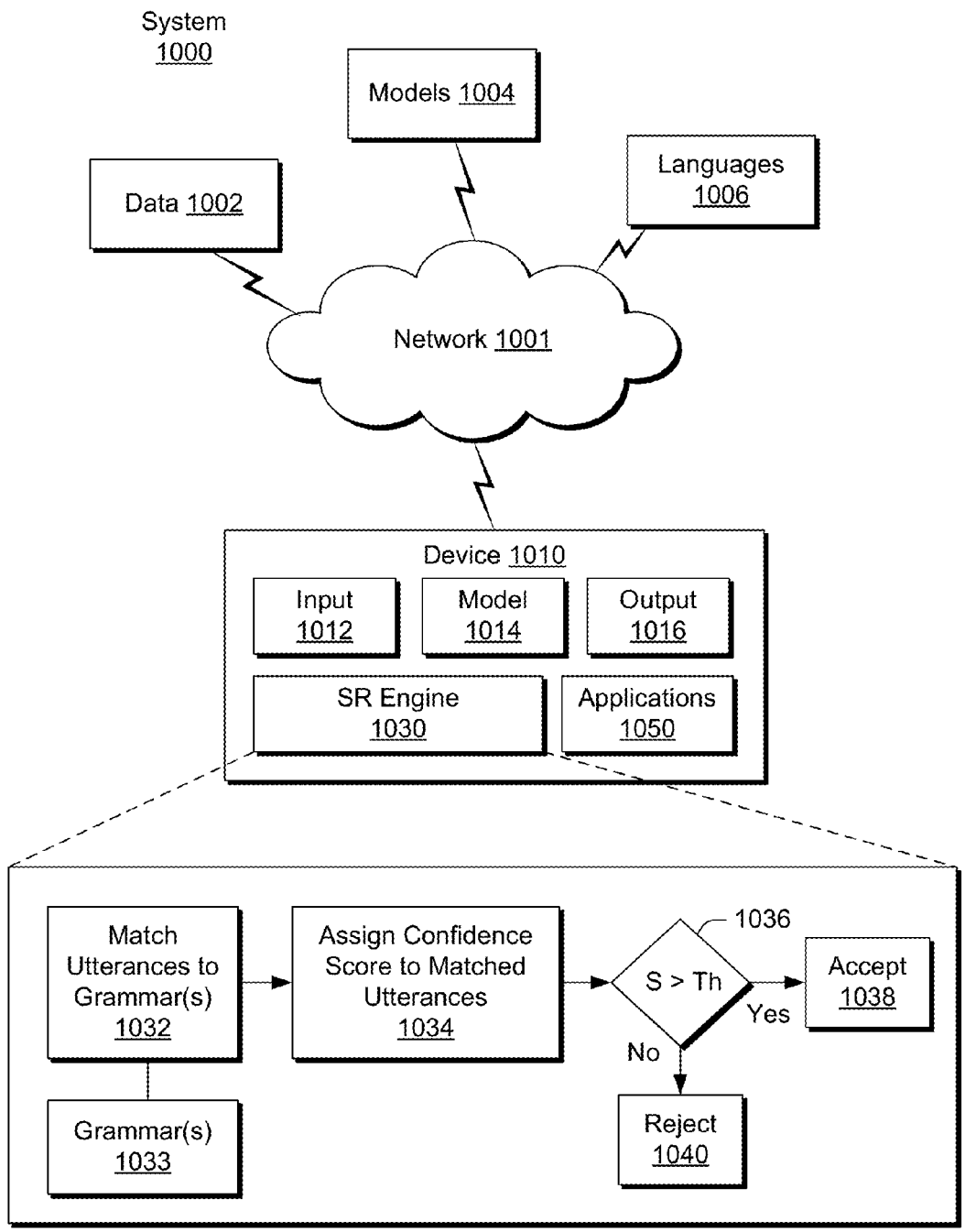
FIG. 10 is a diagram of an example of a system.

FIG. 10 shows an example of a system 1000 that includes a network 1001 (e.g., the Internet, the cloud, an intranet, etc.) that may be operatively coupled to data 1002 (e.g., a data storage), information as to one or more models 1004 and/or information as to one or more languages 1006. As an example, a device 1010 may include an input 1012, a model 1014, an output 1016, a speech recognition engine 1030 and one or more applications 1050. As an example, the device 1010 may access information via the network 1001, transmit information via the network 1001, etc.

As an example, the device 1010 may acquire audio data locally and transmit the audio data to a remote location, for example, for processing. In such an example, the device 1010 may receive a model based at least in part on the remote processing. As an example, the device 1010 may implement the model using circuitry, for example, to process audio data, for example, for purposes of speech recognition.

As an example, the speech recognition engine 1030 may include circuitry that can implement a method that includes a match block 1032 that can access one or more grammars 1033 for matching utterances to a grammar, an assignment block 1034 for assigning a confidence score (e.g., or scores) to a matched utterance, and a decision block 1036 for deciding whether the confidence score (e.g., or scores) exceed a confidence level threshold. As shown in the example of FIG. 10, based at least in part on the decision block 1036, the method, per an acceptance block 1038, may include accepting a matched utterance (e.g., as being recognized) or the method, per a rejection block 1040, may include rejecting a matched utterances (e.g., as not being recognized). In such an example, the method may take one or more actions, for example, instructing one or more of the applications 1050, etc. (e.g., presentation of text, entering a command, etc.).

As an example, a speech recognition system may include one or more statistically-based speech recognition algorithms. As an example, a speech recognition algorithm may include one or more Hidden Markov Models (HMMs). As an example, a HMM may receive as input information that may be, for example, processed audio information. As an example, a HMM may output a sequence of symbols or quantities, for example, based at least in part on input information. As an example, speech recognition algorithm may be trained, for example, by input of information that may be based on speaking particular text, making particular sounds, etc.

As an example, a speech recognition system may include generation of one or more vectors that may optionally be coefficients resulting from a Fourier transform of a short time window of speech (e.g., optionally processed audio data) and, for example, decorrelating a spectrum using a cosine transform. In such an example, coefficients may be selected based on order, significance, etc. As an example, a HMM may tend to include in individual states a statistical distribution that may be a mixture of diagonal covariance Gaussians (e.g., that may give a likelihood for an observed vector). As an example, individual words, individual phonemes (e.g., sounds), etc. may provide for a corresponding output distribution. As an example, a HMM for a sequence of sounds (e.g., words, phonemes, etc.) may be generated by concatenating individual trained HMMs for individual sounds (e.g., separate words, phonemes, etc.).

As an example, one or more components of or associated with a speech recognition system may include one or more application programming interfaces (APIs). As an example, an API may provide for making calls and receiving responses. As an example, an API may provide for interactions between components such as, for example, components of one or more of an audio processing system, a speech recognition system, an application, an operating system, etc.

As an example, a system, a method, etc. may be configurable to or configured for a particular spoken language. Some examples of languages include the Indo-European languages (e.g., English, Spanish, Russian, Hindustani, etc.) and the Sino-Tibetan languages (e.g., Mandarin Chinese, Cantonese, Japanese, Korean, etc.). As an example, a system may include circuitry for amplification of individualized formant frequencies for a particular language or languages. As an example, a system may include trainable circuitry that may be, for example, trained for a particular language or languages for an individual to generate trained circuitry. As an example, such trained circuitry may provide for amplification of individualized formant frequencies for that individual. As an example, circuitry may be reset, retrained, etc., for example, for use by another individual, for use with respect to another language, etc.

As an example, a speech recognition system may implement filtering techniques that may be frequency dependent. As an example, speech (e.g., audio signals or data) may have, in terms of frequencies, a bandwidth, for example, centered in a range that may vary from individual to individual. As an example, speech resonances such as formants may vary with respect to physiology such as, for example, an individual's height (e.g., which may correspond to length of the vocal tract, etc.).

As an example, a method may include digitizing speech (e.g., audio signals or data) by applying a low-pass filter, a high pass comb filter, and a noise reduction technique such as beam forming. In such an example, cleanliness from artifacts of the noise reduced speech may vary depending on the frequency specific characteristics of such filters. As differences may exist from individual to individual, a system that operates according to a fixed set of filter values may be sub-optimal (e.g., not work well when applied to various individuals). For example, the higher the high-pass filter used, the more aliasing artifacts may leak into lower bands. Further, for example, the lower a low-pass filter is used, the more single-frequency noise components and their aliased artifacts may show up in a signal. Yet further, for example, beam forming filters may introduce aliased noise spikes at lower multiples of the noise zero frequencies. As an example, a method that may implement one or more parameter values that are based at least in part on individualized formant frequencies may provide "cleaner" output for an individual. Such cleaner output may, in turn, enhance performance of speech recognition.

As an example, a method may include detecting a set of words (e.g., a first few words of sentence, etc.) and analyzing the set of words to determine a mode of the formative sounds within the sample (e.g., using a vowel trapezoid framework, etc.). As an example, such a mode may be used as a basis for forming a model. As an example, a method may include analyzing as few as three words to determine a mode, for example, depending on the utterance (e.g., words, consonants, vowels, etc.). As an example, a sweep of low, high, and noise reducing filters may be applied to a mode, for example, using circuitry that may include digital signal processing (DSP) circuitry. As an example, outputs of such a sweep may be analyzed, for example, in an effort to avoid introduction of aliasing artifacts (e.g., in regions of a formant space where formants may occur). As an example, a method may include checking signal quality, for example, to avoid reduction in signal quality with respect to one or more formant frequencies. As an example, by analyzing one or more sweeps, one or more values of one or more parameters may be determined (e.g., selected), for example, that produce the least amount of distortion and largest amount of noise reduction. In such an example, the one or more values may be implemented for processing additional audio signals, data, etc. (e.g., via filtering, amplifying, etc.). As an example, parameters may include, for example, one or more of the parameters 990 of FIG. 9.

Figure 11:
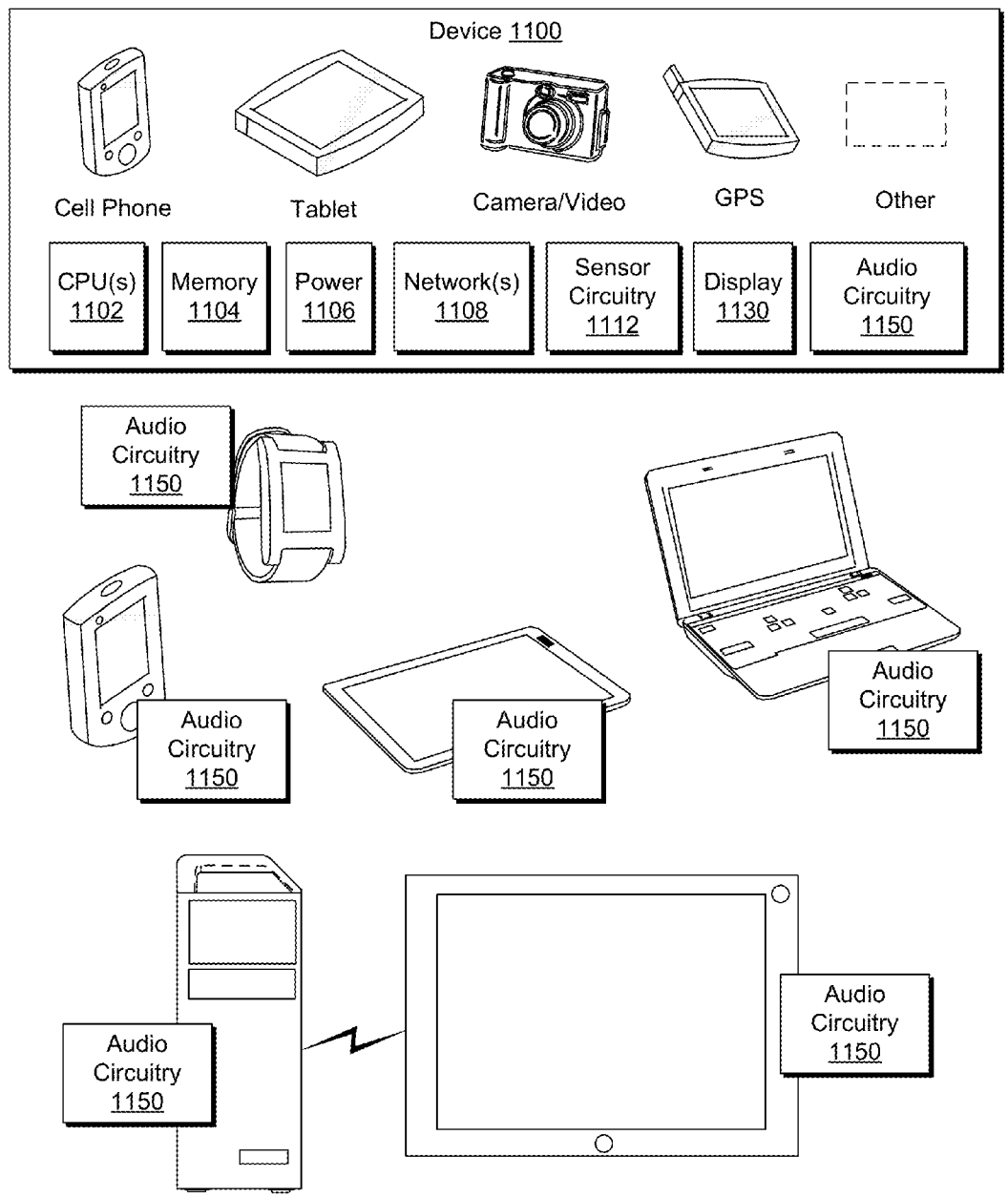
FIG. 11 is a diagram of an example of a device.

FIG. 11 shows an example of a device 1100 that may include audio circuitry 1150. As shown, the device 1100 may be configured, for example, as a watch, a phone, a tablet, a notebook, a desktop system, a camera, a GPS device or other device. As an example, a device may be a vehicle, an appliance, a security system, a robot, etc.

As an example, the device 1100 may include one or more processors 1102, memory 1104, a power source 1106, one or more network interfaces 1108, sensor circuitry 1112, a display 1130 (e.g., or displays), and audio circuitry 1150. As an example, audio circuitry 1150 may be operatively coupled to a processor, may include a processor, etc. As an example, the audio circuitry 1150 may be configured for one or more of acquiring audio signals, filtering, amplifying, speech recognition, etc.

As an example, a method can include receiving audio data within a band of frequencies; amplifying individualized formant frequencies within the band of frequencies; and outputting audio data that includes at least one of the amplified individualized formant frequencies. Such an example may further include receiving audio data associated with an individual, analyzing the audio data associated with the individual for at least two vowels and, based at least in part on the analyzing, outputting parameter values for amplifying the individualized formant frequencies. In such an example, the at least two vowels may include at least one of: a lower mid, central unrounded vowel; a lower back, mid unrounded vowel; and a lower high, back rounded vowel.

As an example, a method may include receiving audio data associated with an individual as a signal and audio data associated with ambient noise where, for example, the method includes amplifying that increases the signal with respect to the ambient noise.

As an example, a method may include applying a low pass noise filter that filters out ambient noise in the audio data that includes frequencies above a low pass cut-off frequency. In such an example, the method may include selecting the low pass cut-off frequency based at least in part on an individualized mode defined in a formant frequency space.

As an example, a method may include applying a high pass noise filter that filters out ambient noise in the audio data that includes frequencies below a high pass cut-off frequency. In such an example, the method may include selecting the high pass cut-off frequency based at least in part on an individualized mode defined in a formant frequency space.

As an example, individualized formant frequencies may include frequency pairs that include a first formant frequency and a second formant frequency. As an example, a method may include performing speech recognition based at least in part on audio data that includes, at least, amplified frequency pairs.

As an example, a system can include a processor; memory operatively coupled to the processor; instructions stored in the memory and executable by the processor to instruct the system to: receive audio data within a band of frequencies; amplify individualized formant frequencies within the band of frequencies; and output audio data that includes at least one of the amplified individualized formant frequencies. Such an example may include instructions to receive audio data associated with an individual, analyze the audio data associated with the individual for at least two vowels and output parameter values for amplification of the individualized formant frequencies. In such an example, the at least two vowels may include at least one of: a lower mid, central unrounded vowel; a lower back, mid unrounded vowel; and a lower high, back rounded vowel.

As an example, a system may include instructions to select at least one cut-off frequency for at least one pass filter based at least in part on an individualized mode in a formant frequency space. In such an example, the at least one pass filter may include a low pass filter, a high pass filter or a low pass filter and a high pass filter. As an example, a system may include at least one pass filter that filters out frequencies in audio data that do not lie within an individualized mode in a formant frequency space.

As an example, a system may include instructions to amplify individualized formant frequencies that include pairs of frequency bands where each band includes a formant frequency associated with a vowel.

As an example, one or more computer-readable media may include processor-executable instructions to instruct a computing device to: receive audio data within a band of frequencies; amplify individualized formant frequencies within the band of frequencies; and output audio data that includes at least one of the amplified individualized formant frequencies. Such an example may include processor-executable instructions to instruct a computing device to receive audio data associated with an individual, analyze the audio data associated with the individual for at least two vowels and output parameter values for amplification of the individualized formant frequencies.

As an example, one or more computer-readable media may include processor-executable instructions to instruct a computing device to filter out frequencies below a high pass filter cut-off frequency and to filter out frequencies above a low pass filter cut-off frequency where, for example, the cut-off frequencies are based on an individualized mode in a formant frequency space.

As an example, an amplifier may include an input for audio signals; a frequency pair map for first and second formants of vowels; amplification circuitry to amplify audio signal frequencies according to the frequency pair map; and an output for audio signals that comprise at least amplified audio signal frequencies. Such an example may include at least one pass filter that includes a pass frequency that passes frequencies that lie within a vowel trapezoid. As an example, an amplifier may include at least one pass filter (e.g., a low pass filter, a high pass filter, a high pass filter and a low pass filter, etc.).

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions. Such circuitry may optionally rely on one or more computer-readable media that includes computer-executable instructions. As described herein, a computer-readable medium may be a storage device (e.g., a memory card, a storage disk, etc.) and referred to as a computer-readable storage medium. As an example, a computer-readable medium may be a computer-readable medium that is not a carrier wave.

Figure 12:
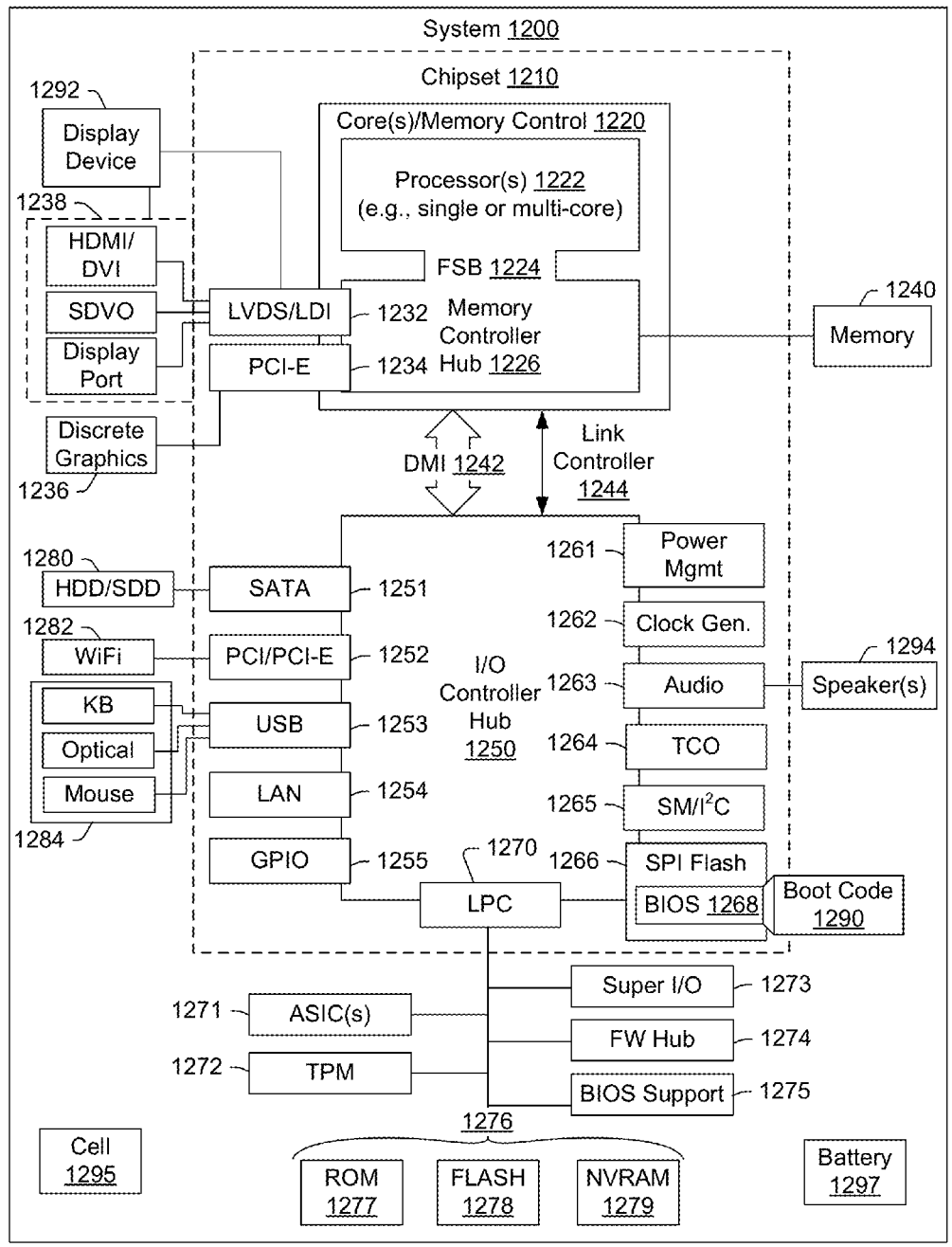
FIG. 12 is a diagram of an example of a system that includes one or more processors.

While various examples of circuits or circuitry have been discussed, FIG. 12 depicts a block diagram of an illustrative computer system 1200. The system 1200 may be a computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a satellite, a base, a server or other machine may include other features or only some of the features of the system 1200. As described herein, a device such as a device illustrated in or described with respect to FIG. 11 (e.g., or another device, etc.) may include at least some of the features of the system 1200.

As shown in FIG. 12, the system 1200 includes a so-called chipset 1210. A chipset refers to a group of integrated circuits, or chips, that are designed (e.g., configured) to work together. Chipsets are usually marketed as a single product (e.g., consider chipsets marketed under the brands INTEL®, AMD®, etc.).

In the example of FIG. 12, the chipset 1210 has a particular architecture, which may vary to some extent depending on brand or manufacturer. The architecture of the chipset 1210 includes a core and memory control group 1220 and an I/O controller hub 1250 that exchange information (e.g., data, signals, commands, etc.) via, for example, a direct management interface or direct media interface (DMI) 1242 or a link controller 1244. In the example of FIG. 12, the DMI 1242 is a chip-to-chip interface (sometimes referred to as being a link between a "northbridge" and a "southbridge").

The core and memory control group 1220 include one or more processors 1222 (e.g., single core or multi-core) and a memory controller hub 1226 that exchange information via a front side bus (FSB) 1224. As described herein, various components of the core and memory control group 1220 may be integrated onto a single processor die, for example, to make a chip that supplants the conventional "northbridge" style architecture.

The memory controller hub 1226 interfaces with memory 1240. For example, the memory controller hub 1226 may provide support for DDR SDRAM memory (e.g., DDR, DDR2, DDR3, etc.). In general, the memory 1240 is a type of random-access memory (RAM). It is often referred to as "system memory".

The memory controller hub 1226 further includes a low-voltage differential signaling interface (LVDS) 1232. The LVDS 1232 may be a so-called LVDS Display Interface (LDI) for support of a display device 1292 (e.g., a CRT, a flat panel, a projector, etc.). A block 1238 includes some examples of technologies that may be supported via the LVDS interface 1232 (e.g., serial digital video, HDMI/DVI, display port). The memory controller hub 1226 also includes one or more PCI-express interfaces (PCI-E) 1234, for example, for support of discrete graphics 1236. Discrete graphics using a PCI-E interface has become an alternative approach to an accelerated graphics port (AGP). For example, the memory controller hub 1226 may include a 16-lane (x16) PCI-E port for an external PCI-E-based graphics card. A system may include AGP or PCI-E for support of graphics. As described herein, a display may be a sensor display (e.g., configured for receipt of input using a stylus, a finger, etc.). As described herein, a sensor display may rely on resistive sensing, optical sensing, or other type of sensing.

The I/O hub controller 1250 includes a variety of interfaces. The example of FIG. 12 includes a SATA interface 1251, one or more PCI-E interfaces 1252 (optionally one or more legacy PCI interfaces), one or more USB interfaces 1253, a LAN interface 1254 (more generally a network interface), a general purpose I/O interface (GPIO) 1255, a low-pin count (LPC) interface 1270, a power management interface 1261, a clock generator interface 1262, an audio interface 1263 (e.g., for speakers 1294), a total cost of operation (TCO) interface 1264, a system management bus interface (e.g., a multi-master serial computer bus interface) 1265, and a serial peripheral flash memory/controller interface (SPI Flash) 1266, which, in the example of FIG. 12, includes BIOS 1268 and boot code 1290. With respect to network connections, the I/O hub controller 1250 may include integrated gigabit Ethernet controller lines multiplexed with a PCI-E interface port. Other network features may operate independent of a PCI-E interface.

The interfaces of the I/O hub controller 1250 provide for communication with various devices, networks, etc. For example, the SATA interface 1251 provides for reading, writing or reading and writing information on one or more drives 1280 such as HDDs, SDDs or a combination thereof. The I/O hub controller 1250 may also include an advanced host controller interface (AHCI) to support one or more drives 1280. The PCI-E interface 1252 allows for wireless connections 1282 to devices, networks, etc. The USB interface 1253 provides for input devices 1284 such as keyboards (KB), one or more optical sensors, mice and various other devices (e.g., microphones, cameras, phones, storage, media players, etc.). On or more other types of sensors may optionally rely on the USB interface 1253 or another interface (e.g., I²C, etc.). As to microphones, the system 1200 of FIG. 12 may include hardware (e.g., audio card) appropriately configured for receipt of sound (e.g., user voice, ambient sound, etc.).

In the example of FIG. 12, the LPC interface 1270 provides for use of one or more ASICs 1271, a trusted platform module (TPM) 1272, a super I/O 1273, a firmware hub 1274, BIOS support 1275 as well as various types of memory 1276 such as ROM 1277, Flash 1278, and non-volatile RAM (NVRAM) 1279. With respect to the TPM 1272, this module may be in the form of a chip that can be used to authenticate software and hardware devices. For example, a TPM may be capable of performing platform authentication and may be used to verify that a system seeking access is the expected system.

The system 1200, upon power on, may be configured to execute boot code 1290 for the BIOS 1268, as stored within the SPI Flash 1266, and thereafter processes data under the control of one or more operating systems and application software (e.g., stored in system memory 1240). An operating system may be stored in any of a variety of locations and accessed, for example, according to instructions of the BIOS 1268. Again, as described herein, a satellite, a base, a server or other machine may include fewer or more features than shown in the system 1200 of FIG. 12. Further, the system 1200 of FIG. 12 is shown as optionally include cell phone circuitry 1295, which may include GSM, CDMA, etc., types of circuitry configured for coordinated operation with one or more of the other features of the system 1200. Also shown in FIG. 12 is battery circuitry 1297, which may provide one or more battery, power, etc., associated features (e.g., optionally to instruct one or more other components of the system 1200). As an example, a SMBus may be operable via a LPC (see, e.g., the LPC interface 1270), via an I²C interface (see, e.g., the SM/I²C interface 1265), etc.

CONCLUSION

Although examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. A method comprising:
   based at least in part on filtering audio data that comprises formants associated with an individual, shifting a formant space model to configure circuitry of a device;
   receiving audio data;
   processing the received audio data via the configured circuitry of the device wherein the processing comprises filtering the received audio data and amplifying formant frequencies within the received audio data; and
   outputting audio data that comprises at least one of the amplified formant frequencies.

2. The method of claim 1 wherein the filtering audio data associated with the individual identifies at least two vowels and outputs parameter values to configure the circuitry.

3. The method of claim 2 wherein the at least two vowels comprise at least one of: a lower mid, central unrounded vowel; a lower back, mid unrounded vowel; and a lower high, back rounded vowel.

4. The method of claim 1 wherein receiving audio data comprises receiving audio data associated with an individual as a signal and audio data associated with ambient noise and wherein the amplifying increases the signal with respect to the ambient noise.

5. The method of claim 1 wherein the processing comprises applying a low pass noise filter that filters out ambient noise in the received audio data that comprises frequencies above a low pass cut-off frequency.

6. The method of claim 5 comprising selecting the low pass cut-off frequency based at least in part on the shifting a formant space model.

7. The method of claim 1 wherein the processing comprises applying a high pass noise filter that filters out ambient noise in the received audio data that comprises frequencies below a high pass cut-off frequency.

8. The method of claim 7 comprising selecting the high pass cut-off frequency based at least in part on the shifting a formant space model.

9. The method of claim 1 wherein the formant space model comprises formant frequencies that comprise frequency pairs that comprise a first formant frequency and a second formant frequency.

10. The method of claim 9 comprising performing speech recognition based at least in part on the audio data that comprises at least the amplified frequency pairs.

11. A system comprising:
a processor;
memory operatively coupled to the processor;
circuitry that comprises filter circuitry and amplifier circuitry;
instructions stored in the memory and executable by the processor to instruct the system to:
based at least in part on filtered audio data that comprises formants associated with an individual, shift a formant space model to configure the circuitry;
receive audio data;
process the received audio data via the circuitry to filter the received audio data and to amplify formant frequencies within the received audio data; and
output audio data that comprises at least one of the amplified formant frequencies.

12. The system of claim 11 wherein the filtered audio data associated with the individual comprises at least two identified vowels for determination of output parameter values to configure the circuitry for amplification of the formant frequencies.

13. The system of claim 12 wherein the at least two vowels comprise at least one of: a lower mid, central unrounded vowel; a lower back, mid unrounded vowel; and a lower high, back rounded vowel.

14. The system of claim 11 comprising instructions to select at least one cut-off frequency for at least one pass filter based at least in part on the formant space model.

15. The system of claim 14 wherein the at least one pass filter comprises a low pass filter, a high pass filter or a low pass filter and a high pass filter.

16. The system of claim 14 wherein the at least one pass filter filters out frequencies in audio data that do not lie within a formant space of the formant space model.

17. The system of claim 11 wherein the formant frequencies comprise pairs of frequency bands wherein each band comprises a formant frequency associated with a vowel.

18. One or more computer-readable media comprising processor-executable instructions to instruct a computing device to:
based at least in part on filtered audio data that comprises formants associated with an individual, shift a formant space model to configure circuitry of the computing device;
receive audio data;
process the received audio data via the circuitry to filter the received audio data and to amplify formant frequencies within the received audio data; and
output audio data that comprises at least one of the amplified formant frequencies.

19. The one or more computer-readable media of claim 18 wherein the filtered audio data associated with the individual comprises at least two identified vowels for determination of output parameter values to configure the circuitry for amplification of the formant frequencies.

20. The one or more computer-readable media of claim 18 further comprising processor-executable instructions to instruct a computing device to filter out frequencies below a high pass filter cut-off frequency and to filter out frequencies above a low pass filter cut-off frequency wherein the cut-off frequencies are based on the formant space model.

* * * * *